(12) United States Patent
Chen et al.

(10) Patent No.: US 8,183,936 B2
(45) Date of Patent: May 22, 2012

(54) PHASE-LOCKED LOOP FREQUENCY SYNTHESIZER AND LOOP LOCKING METHOD THEREOF

(75) Inventors: Wei Zen Chen, Hsinchu (TW); Yen-Wei Lee, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 135 days.

(21) Appl. No.: 12/788,021

(22) Filed: May 26, 2010

(65) Prior Publication Data

US 2011/0175682 A1 Jul. 21, 2011

(30) Foreign Application Priority Data

Jan. 20, 2010 (TW) ................................ 99101442 A

(51) Int. Cl.
*H03L 7/00* (2006.01)
(52) U.S. Cl. ............................ 331/17; 341/143; 375/376
(58) Field of Classification Search .................... 331/17; 341/143; 375/376
See application file for complete search history.

(56) References Cited

U.S. PATENT DOCUMENTS

2006/0170505 A1 * 8/2006 Humphreys et al. ............ 331/16

FOREIGN PATENT DOCUMENTS

| TW | 400672 B | 8/2000 |
|---|---|---|
| TW | 200919976 | 5/2009 |

* cited by examiner

*Primary Examiner* — James E Goodley
(74) *Attorney, Agent, or Firm* — Peter F. Corless; Steven M. Jensen; Edwards Wildman Palmer LLP

(57) ABSTRACT

A phase-locked loop frequency synthesizer and a loop locking method thereof are provided. The phase-locked loop frequency synthesizer includes a reference route sigma-delta modulator feedback circuit, a reference phase integration circuit coupled to the output end of the reference route sigma-delta modulator feedback circuit, a phase/frequency detector coupled to the output ends of the reference and feedback phase integration circuit, a loop filter coupled to the output end of the phase/frequency detector and the input end of the reference route sigma-delta modulator feedback circuit, an oscillator coupled to the output end of the loop filter, and a feedback phase integration circuit coupled to the output end of the oscillator and the input end of the phase/frequency detector. In the phase-locked loop frequency synthesizer, the oscillator generates corresponding frequency output signals which yield the advantages of resisting noise signals, enhancing resolution, and facilitating integration.

15 Claims, 6 Drawing Sheets

PHASE-LOCKED LOOP FREQUENCY SYNTHESIZER AND LOOP LOCKING METHOD THEREOF

CROSS-REFERENCES TO RELATED APPLICATIONS

This application claims under 35 U.S.C. §119(a) the benefit of Taiwanese Application No. 99101442 filed Jan. 20, 2010 the entire contents of which is incorporated herein by reference.

BACKGROUND OF THE INVENTION

1. Field of the Invention

This invention relates to phase-locked loop frequency synthesizers and loop locking methods thereof, and more particularly, to a non-integer digitally phase-locked loop frequency synthesizer and a loop locking method thereof.

2. Description of Related Art

A phase-locked loop (PLL) is an electronic control system for generating a signal that has a constant ratio relative to a phase of a reference signal. The PLL synchronizes the frequency/phase of the reference signal and an output signal by using a feedback principle. When the PLL detects that the frequency/phase of the reference signal is changed, an internal feedback system adjusts the output signal (that is, adjusting the frequency of an oscillator), until the frequencies/phases of the signal output by the PLL and the reference signal are synchronous. In other words, the frequency/phase of the output signal can catch up with, or can be locked by, the frequency/phase of the reference signal.

The PLL may recover data and clock, modulate and demodulate frequencies and phases, and generate stable clock with multiplied frequency. Accordingly, the PLL is widely applied to various digital electronic instruments, consumer products, and communications devices such as a frequency synthesizer. According to the prior art, a PLL is usually implemented by an analog technique. However, in a deep submicron fabrication process, a traditional analog PLL has a low voltage headroom, and thus has a small tuning range. Thus, it is difficult to design a conventional analog PLL, and the PLL may not have a smaller area as the fabrication process advances. Therefore, it is difficult for the analog PLL to achieve the dual characteristics of fast phase locking and low noises.

In recent years, as the electronic element fabrication process made a significant progress, a digital circuit has more advantages than an analog circuit in performance and area. Regarding a conventional analog PLL, a concept of a digital oscillator is introduced to the art. The frequency of the oscillator is controlled by a digital signal, such that high oscillation rate and high resolution may be achieved. Accordingly, an all digital PLL applicable to an RF band is therefore realized. Taiwan Patent No. 400672 discloses a digital frequency synthesizer and a frequency synthesizing method thereof. The digital frequency synthesizer includes a frequency tracking unit, a pair of variable loop oscillators, and a clock control unit. The two oscillators act as clock signal outputs and provide a feedback signal to the frequency tracking unit. However, a higher frequency is difficult to be generated, because of the adoption of two frequency generators. Moreover, the two frequency generators, if not matching very well, may cause output frequency errors. Laid-open Taiwan Publication No. 200919976 discloses an all digital PLL that includes a digital loop filter and a modulator crossing the loop filter. The modulator includes an accumulator, an accumulation amplifier, and a route magnification device. A time-to-digital converter is used in a loop to detect a fractional part of a phase. However, the time-to-digital converter is complicated, and its resolution is easily affected by the fabrication process offset.

Note that for a convention phase-locked loop frequency synthesizer technique, in order to ensure system stability, a loop filter circuit 22 is realized by an integral route, which is realized by an integrator (composed of an adder 225 and a register 223), and a proportional route, as shown in FIG. 1, which shows a phase-locked loop frequency synthesizer according to the prior art. In the process that a loop is locked finally, an output of a phase/frequency detector 21 is sent to the loop filter circuit 22 for filtering, and then sent to the oscillator 23 for adjusting an output signal frequency $f_{OUT}$. However, this technique, though solving the system stability problem, may generate great spurs on the output signal frequency $f_{OUT}$. Such phenomenon is significant especially in a digitally phase-locked loop frequency synthesizer.

Compared with an analog circuit, a digital circuit still suffers from quantization noises, and quantification errors. Additionally, in a conventional non-integer PLL a multi-mode divider has to be redesigned in different fabrication processes, which costs more money and consumes more power. Besides, in order to consider both resolution magnification and phase-locked range, it is necessary to use an accumulator that has a great number of bits, which consumes hardware space.

Therefore, it is imperative to provide a non-integer digitally phase-locked loop frequency synthesizer and a loop locking method thereof, which have the advantages of programmability, resisting noise signals, increasing resolution and ease in integration, will not be affected by various factors, such as environment, temperature and voltage shift, and occupies a smaller area as the fabrication process makes progress.

SUMMARY OF THE INVENTION

In the view of the above-mentioned problems of the prior art, the present invention provides a phase-locked loop frequency synthesizer and a loop locking method thereof, which can increase resolution, reduce noises and complexity, and have fast locking characteristic.

The phase-locked loop frequency synthesizer of the present invention includes: a reference route sigma-delta modulator feedback circuit for generating a frequency control code according to a fraction frequency control code and an integer frequency control code; a reference phase integration circuit for generating and outputting reference phase information according to a reference signal and the frequency control code generated by the reference route sigma-delta modulator feedback circuit; a phase/frequency detector for detecting feedback phase information and the reference phase information, and outputting phase difference information; a loop filter including a locking process state machine circuit and a loop filter circuit having a loop parameter, the locking process state machine circuit being for adjusting the loop parameter according to the phase difference information, and the loop filter circuit being for outputting a control signal according to the loop parameter adjusted; an oscillator for generating a frequency output signal according to the control signal outputted by the loop filter circuit; and a feedback phase integration circuit for generating the feedback phase information according to the frequency output signal provided by the oscillator, and outputting the feedback phase information to the phase/frequency detector, wherein, the reference route sigma-delta modulator feedback circuit pulls a negative feedback from the phase/frequency detector to the reference phase integration circuit, enabling the oscillator to generate the frequency output signal corresponding to the reference signal.

The reference route sigma-delta modulator feedback circuit of the phase-locked loop frequency synthesizer of the present invention includes a route magnification device having a route parameter, and adjusts the phase difference information by setting the route parameter. Further, the loop filter circuit of the phase-locked loop frequency synthesizer of the present invention includes a loop magnification device having the loop parameter that is set by the locking process state machine circuit, so as to adjust the control signal output by the loop filter.

Additionally, the reference route sigma-delta modulator feedback circuit includes a sigma-delta modulator and two adders. The reference phase integration circuit may be an accumulator. The sigma-delta modulator converts the fraction frequency control code into a fraction control code that is added by the integer frequency control code. The accumulator accumulates the fraction control code added by the integer frequency control code and generates the reference phase information.

Besides, the phase/frequency detector comprises a multiplexer that operates either in a frequency-acquisition state or in a phase-tracking state. The phase/frequency detector outputs the phase difference information directly while the multiplexer is operating in the frequency-acquisition state and converts the phase difference information into a phase difference polarity information by using a binary phase detector while the multiplexer is operating in the phase-tracking state.

The loop locking method applicable to the phase-locked loop frequency synthesizer of the present invention includes the steps of: (1) cutting off the feedback input from the phase/frequency detector by the reference route sigma-delta modulator feedback circuit, for the phase/frequency detector to operate in a frequency-acquisition state and a register in the loop filter circuit to be shut off; (2) providing the fraction frequency control code and the integer frequency control code to the reference route sigma-delta modulator feedback circuit to generate the frequency control code, and providing a reference signal to the reference phase integration circuit to output the reference phase information to the phase/frequency detector according to the frequency control code, at the same time, enabling the feedback phase integration circuit to generate the feedback phase information according to the output signal of the oscillator; (3) enabling the phase/frequency detector to calculate a difference between the reference phase information and the feedback phase information and then output the phase difference information; (4) enabling the locking process state machine circuit to adjust the loop parameter of the loop filter circuit according to the phase difference information, to allow the loop filter circuit to output a control signal according to the adjusted loop parameter, and to enable the oscillator to generate the output signal according to the control signal; (5) enabling the output signal to generate the feedback phase information through the feedback phase integration circuit and input to the phase/frequency detector, and iterating steps (3) to (5) if the loop parameter is still greater than a first predetermined value, or otherwise, proceeding to step (6); and (6) enabling the locking process state machine circuit to turn on the register of the loop filter circuit and keep the loop parameter at the first predetermined value, and enabling the phase/frequency detector to operate in the phase-tracking state and set the route parameter of the reference route sigma-delta modulator feedback circuit to the second predetermined value, allowing the phase/frequency detector and the reference route sigma-delta modulator feedback circuit to form a negative feedback circuit, and the output signal of the oscillator to be the frequency signal corresponding to the reference signal.

Compared with the prior art, the phase-locked loop frequency synthesizer of the present invention pulls the proportional route connected to the oscillator in the conventional loop filter technique back to the reference phase integration circuit, in order to adjust the reference phase of the phase-locked loop frequency synthesizer, i.e., the negative feedback pulled from phase/frequency detector through the reference route sigma-delta modulator feedback circuit to the reference phase integration circuit. Besides, the loop filter sent into the oscillator is composed by an integration route realized by an integrator (which is composed of the adder 1422 and the register 1423). Therefore, through the realization of the loop locking method of the present invention, the problem relating to system stability may be solved, the spurs on the frequency output signal $f_{OUT}$ may be reduced effectively, and the output efficiency of the phase-locked loop frequency synthesizer is greatly improved.

Moreover, the phase-locked loop frequency synthesizer and the loop locking method thereof of the present invention, through the addition of the sigma-delta modulator into the reference route sigma-delta modulator feedback circuit, may reduce the bit number of the accumulator (i.e., the reference phase integration circuit) in the phase-locked loop frequency synthesizer, and reduce noised in the loop. The locking process state machine circuit in the loop filter may adjust the loop parameter according to the phase difference output of the phase/frequency detector, allowing the output signal generated by the digitally controlled oscillator to approach to the provided reference signal gradually. When the loop parameter is adjusted to be the first predetermined value, the route parameter of the reference route sigma-delta modulator feedback circuit is set to the second predetermined value, enabling the negative feedback from the phase/frequency detector to the reference route sigma-delta modulator, and the output signal of the oscillator to be the frequency signal corresponding to the reference signal.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
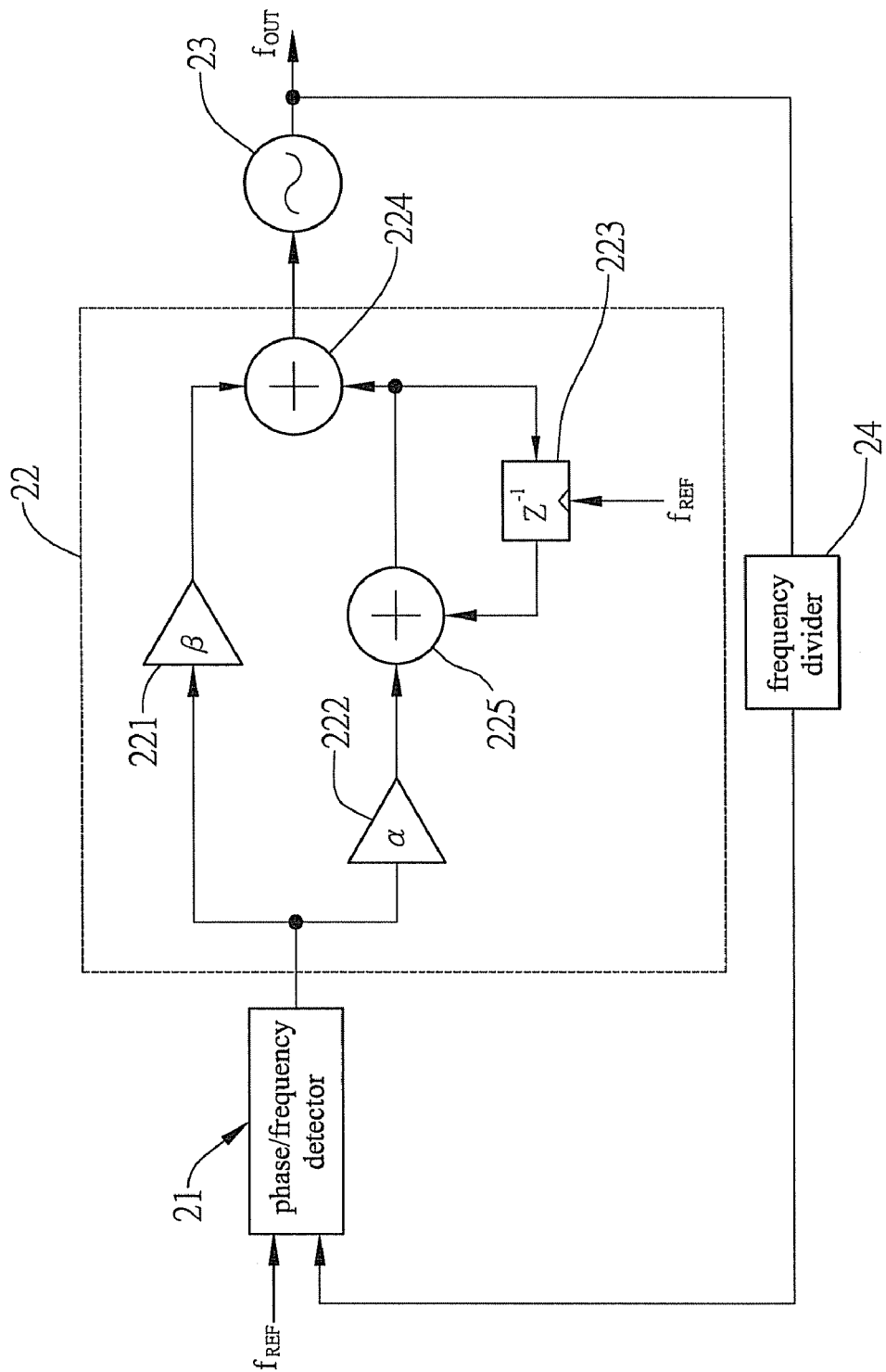
FIG. 1 is a schematic diagram of a phase-locked loop frequency synthesizer according to the prior art.
Figure 2:
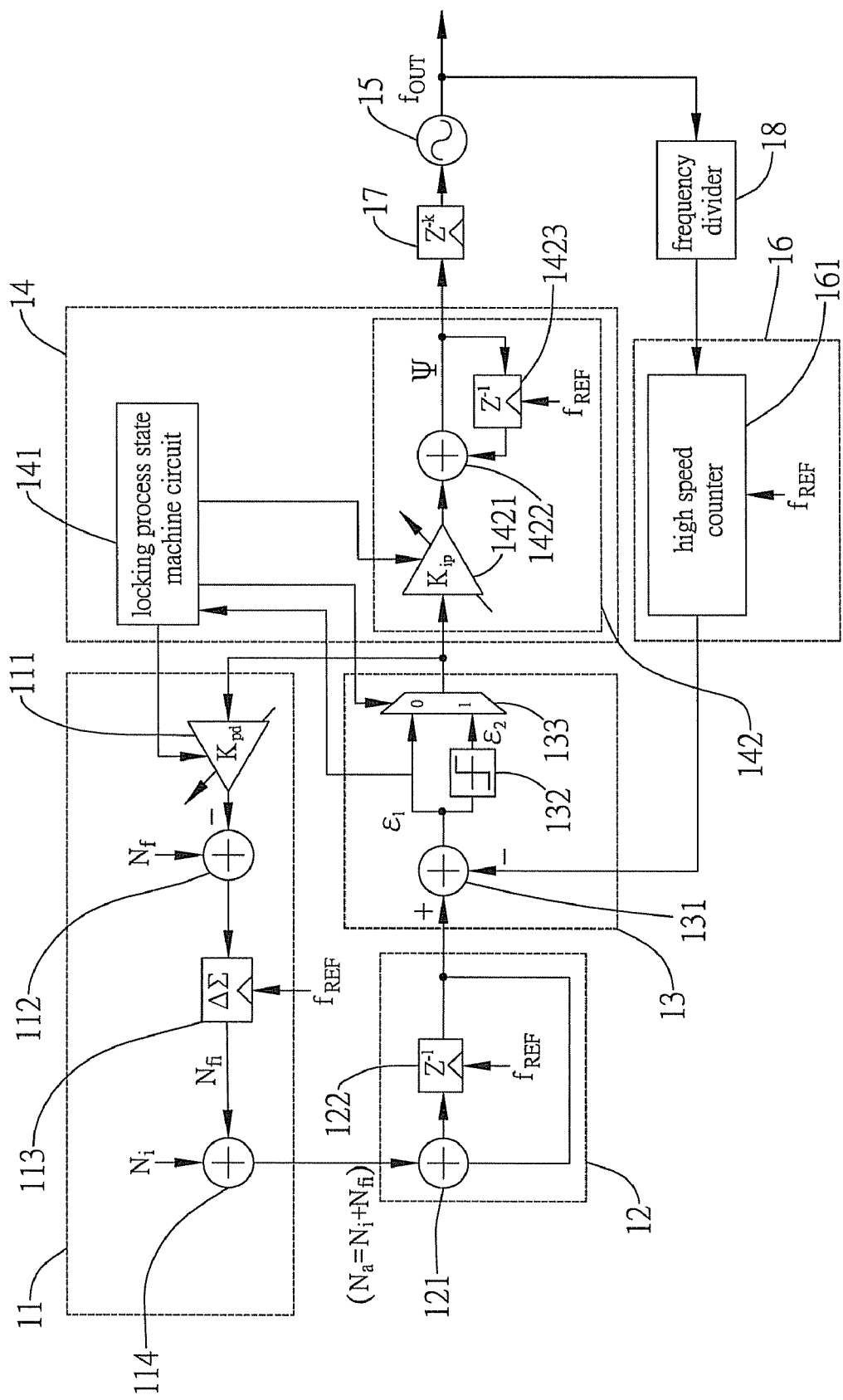
FIG. 2 is a schematic diagram of a phase-locked loop frequency synthesizer according to the present invention.

Please refer to FIG. 2, which is a schematic diagram of a phase-locked loop frequency synthesizer according to the present invention. The phase-locked loop frequency synthesizer comprises a reference route sigma-delta modulator feedback circuit 11, a reference phase integration circuit (reference phase accumulator, reference PAC) 12, a phase/frequency detector (dual-mode phase frequency detector, DPD) 13, a loop filter 14, a digitally controlled oscillator (DCO) 15 and a feedback phase integration circuit (feedback phase accumulator, feedback PAC) 16. Note that in the embodiment, only the basic primary structure of the phase-locked loop frequency synthesizer of the present invention is shown in FIG. 2, and other embodiments may include other secondary components.

The reference route sigma-delta modulator feedback circuit 11 includes a route magnification device 111, adders 112 and 114, and a sigma-delta modulator 113. The reference route sigma-delta modulator feedback circuit 11 generates a frequency control code $N_a$ by inputting a fraction frequency control code $N_f$ (fractional number) and an integer frequency control code $N_i$ (integer number).

The route magnification device 111 adjusts a feedback input of the phase/frequency detector 13. In the embodiment, the route magnification device 111 has a route parameter $K_{pd}$ (programmable gain). Preferably, an initial value $K_{pd,0}$ of the route parameter $K_{pd}$ is substantially equal to zero. When the route parameter $K_{pd}$ is set to zero, the feedback route fed by the phase/frequency detector 13 is broken equivalently. Accordingly, the input phase difference information sent into the additional negative feedback is zero.

The adder 112 is coupled to an output end of the route magnification device 111, for receiving an output of the route magnification device 111. A fraction frequency control code $N_f$ is provided to the adder 112, and the adder 112 performs a subtraction process on the fraction frequency control code $N_f$ and the output of the route magnification device 111 to generate a subtraction value. In other words, under a condition that a negative feedback is pulled back from the phase/frequency detector 13, the route magnification device 111 and the adder 112 together form a negative feedback loop.

The sigma-delta modulator 113 is coupled to an output end of the adder 112, for receiving an output of the adder 112, converting the output into a fraction control code $N_{fi}$, and outputting the fraction control code $N_{fi}$ to the adder 114. Specifically speaking, the sigma-delta modulator 113 reduces the order of the fraction frequency control code $N_f$, so as to reduce the bit number of the reference phase integration circuit 12. For example, where the fraction frequency control code $N_f$ has eight bits, the sigma-delta modulator 113 may reduces the eight bits to two bits.

The adder 114 is coupled to an output end of the sigma-delta modulator 113, for receiving the fraction control code $N_{fi}$ from the sigma-delta modulator 113. An integer frequency control code $N_i$ is provided to the adder 114, and the adder 114 performs an addition process on the integer frequency control code $N_i$ and the fraction control code $N_{fi}$ and outputs frequency control code $N_a$ ($N_a=N_i+N_{fi}$) to the reference phase integration circuit 12.

The reference phase integration circuit 12 is coupled to an output end of the adder 114, and includes an adder 121 and a register 122. The reference phase integration circuit 12 generates and outputs reference phase information according to the frequency control code $N_a$ ($N_a=N_i+N_{fi}$) outputted by the reference route sigma-delta modulator feedback circuit 11. In practice, the reference phase integration circuit 12 is an accumulator. The reference phase integration circuit 12 performs an accumulation process on the frequency control code $N_a$ ($N_a=N_i+N_{fi}$). In the long run, accumulating the frequency control code $N_a$ is equivalent to accumulating the total frequency control code N ($N=N_i+N_f$). Therefore, phases accumulated by the accumulator may be regarded as reference phases, and the reference phase information are sent to the phase/frequency detector 13.

In an embodiment, when a rising edge of each reference signal (that is, the reference frequency, $f_{REF}$, that is provided to the sigma-delta modulator 113, registers 122 and 1423, and a high-speed counter 161, as shown in FIG. 2) is coming, the sigma-delta modulator 113 will generate different integer outputs (that is, the fraction control code $N_{fi}$) at each time point as time goes by. The integer combination that changes with time enables the sigma-delta modulator 113 to output a fractional number, i.e., the provided fraction frequency control code $N_f$ in the long run. In other words, although the input frequency control code ($N_a=N_i+N_{fi}$) that the reference phase integration circuit 12 accumulates each rising edge of the reference sinal is always an integer, the nature of sigma-delta modulator 13 makes the fraction control code $N_{fi}$ eventually equals to the fraction frequency control code $N_f$. Therefore, the reference phase integration circuit 12 accumulates phases information at each rising edge of the reference signal is actually the provided total frequency control code N ($N=N_i+N_f$).

The phase/frequency detector 13 is coupled to an output end of the reference phase integration circuit 12, and includes an adder 131, a binary phase detector (bang-bang) 132 and a multiplexer 133. The phase/frequency detector 13 detects the reference phase information and the feedback phase information, and then generates phase difference information $\epsilon_1$ while the frequency synthesizer of the present invention is operating in a frequency-acquisition state, or generates a phase difference information polarity $\epsilon_2$ while the frequency synthesizer is operating in a phase-tracking state. The so-called frequency-acquisition state means that the output of the phase/frequency detector 13 is fed to the loop filter circuit 142 of a next stage directly, and the phase-tracking state means that the output of the phase/frequency detector 13 is also fed to the reference route sigma-delta modulator feedback circuit 11. The switching mechanism of the frequency-acquisition state and the phase-tracking state will be described in detail in the following paragraphs.

The adder 131 is coupled to the output end of the register 122 and the output end of the feedback phase integration circuit 16. The adder 13 subtracts the reference phase information output, accumulated by the reference phase integration circuit 12, by the feedback phase information output, accumulated by the feedback phase integration circuit 16, and generates the phase difference information $\epsilon_1$.

The binary phase detector (bang-bang) 132 is coupled to an output end of the adder 131, for converting the phase difference information $\epsilon_1$, generated in the frequency-acquisition state into the phase difference information polarity $\epsilon_2$ when the loop is in the phase-tracking state. In practice, the phase difference information polarity $\epsilon_2$ is a binary number. $\epsilon_2$ is 1 when $\epsilon_1$ is not less than zero, while $\epsilon_2$ is −1 when $\epsilon_1$ is less than zero. The phase difference information $\epsilon_1$ is interpreted as a frequency difference, and the phase difference information polarity $\epsilon_2$ is interpreted as a phase difference. The multiplexer 133 selectively outputs either the phase difference information $\epsilon_1$ or the phase difference information polarity $\epsilon_2$ according to a command of the locking process state machine circuit 141.

The multiplexer 133 is coupled to the output ends of the adder 131 and the binary phase detector 132, and input ends of the loop filter circuit 142 and the reference route sigma-delta modulator feedback circuit 11. The command of the locking process state machine circuit 141 determines whether the multiplexer 133 is operating in the frequency-acquisition state or phase-tracking state. In the embodiment, it is only when the loop parameter $K_{ip}$ needs to reach a first predetermined value $K_{ip,min}$ for entry into the phase-tracking state, does the locking process state machine circuit 141 turn on the binary phase detector 132 to enable the multiplexer 133 to output the phase difference information polarity $\epsilon_2$ to the loop filter circuit 142 and the reference route sigma-delta modulator feedback circuit 11, or else, in the frequency-acquisition state, the phase/frequency detector 13 outputs the phase difference information $\epsilon_1$ only and sends the phase difference information $\epsilon_1$ to the loop filter circuit 142 only.

In the phase-tracking state, through setting the route parameter $K_{pd}$, the reference route sigma-delta modulator feedback circuit 11 adjusts the negative feedback pulled by the phase/frequency detector 13 and sends the negative feedback to the sigma-delta modulator 113. Note that in a general design, the fraction frequency control code $N_f$ is input to the sigma-delta modulator 113 directly to force the sigma-delta modulator 113 to output a constant number-carrying signal to approach the fraction frequency control code $N_f$. For example, "0" is output when carrying does not happen, and "1" is output when the carrying happens. However, the constant pattern of number-carrying signals of 0 and 1 cause measurement errors, which results in significant fractional spurs at the frequency output signal $f_{out}$. In the present invention, through replacing the fixed input of the sigma-delta modulator 113 with the subtraction result of the fraction frequency control code $N_f$ and the route parameter $K_{pd}$ of the negative feedback, the pattern of the number-carrying signal output by the sigma-delta modulator 113 is scrambled effectively. Accordingly, the measurement errors output by the sigma-delta modulator 113 are scattered, and the fractional spurs of $f_{OUT}$ are depressed effectively.

The loop filter 14 is coupled to the output end of the phase/frequency detector 13 and the input end of the reference route sigma-delta modulator feedback circuit 11, and includes a locking process state machine circuit 141 and a loop filter circuit 142 with a loop parameter $K_{ip}$. The locking process state machine circuit 141 adjusts the loop parameter $K_{ip}$ according to the phase difference information $\epsilon_1$, enabling the loop filter circuit 142 to output a control signal according to the adjusted loop parameter $K_{ip}$. The loop filter circuit 142 includes a loop magnification device 1421, an adder 1422 and a register 1423.

The loop magnification device 1421 has a loop parameter $K_{ip}$. The locking process state machine circuit 141 sets the loop parameter $K_{ip}$, so as to adjust the control signal output by the loop filter 14.

The register 1423 enables the loop filter circuit 142 to perform a phase-locking process when the loop parameter $K_{ip}$ is set to the first predetermined value $K_{ip,min}$ by the locking process state machine circuit 141. The adder 1422 and the register 1423 together form an integration circuit when the phase-locking process is performed.

When a frequency-acquisition acquisition process is performed initially, the locking process state machine circuit 141 detects the phase difference information $\epsilon_1$, so as to adjust the loop parameter $K_{ip}$, and the register 1423 of the loop filter circuit 142 is used for storing a predetermined control-adjust signal $\psi$. When the frequency-acquisition process is successfully performed for the first time, the locking process state machine circuit 141 stores the current control-adjust signal $\psi$ into the register 1423 and reduces the loop parameter $K_{ip}$ simultaneously. The loop filter circuit 142 generates a loop control signal according to the reduced loop parameter $K_{ip}$, and adds the loop control signal to the control-adjust signal $\psi$ stored in the register 1423, so as to generate a control signal for controlling the digitally controlled oscillator 15. Then, iterating the detection of the phase difference information $\epsilon_1$ to adjust the loop parameter $K_{ip}$ and output the control signal that controls the digitally controlled oscillator 15. The register 1423 is not turned on to perform the phase-tracking process until the loop parameter $K_{ip}$ is adjusted to become the first predetermined value $K_{ip,min}$. When the frequency-acquisition process is performed, the loop filter circuit 142 is a directly fed circuit. Upon every instance of adjusting the loop parameter $K_{ip}$, the register 1423 temporarily stores the control-adjust signal $\psi$ generated by the loop filter circuit 142 in the current instance, so as for the current control-adjust signal $\psi$ to be added to the loop control signal generated the reduced loop parameter $K_{ip}$ in the next instance. Therefore, when the frequency-acquisition process is performed, the output generated by the loop filter circuit 142 will not be stored in the register 1423 according to the clock of the reference signal. However, when the phase-locking process is performed, the loop filter circuit 142 functions as an integration circuit, and the register 1423 will perform, together with the adder 1422, the accumulation process when the rising edge of each reference signal is coming.

The digitally controlled oscillator 15 is coupled to the output end of the loop filter circuit 142 and the input end of the feedback phase integration circuit 16, for generating an output signal (output frequency, $f_{OUT}$) according to the control signal output by the loop filter circuit 14. Note that in the embodiment the digitally controlled oscillator is used to strengthen the effectiveness of the present invention, while in other embodiments, analog-controlled oscillator or other oscillators, together with a digital to analog converter (DAC), will also achieve the effectiveness of the present invention.

The feedback phase integration circuit 16 is coupled to the output end of the digitally controlled oscillator 15 and the input end of the phase/frequency detector 13, and includes a high-speed counter 161. The feedback phase integration circuit 16 generates the feedback phase information according to the frequency output signal provided by the digitally controlled oscillator 15 and outputs the feedback phase information to the phase/frequency detector 13.

In practice, as the locking process state machine circuit 141 adjusts the loop parameter $K_{ip}$ of the loop filter circuit 142 according to the phase difference information $\epsilon_1$ output by the phase/frequency detector 13, the loop parameter $K_{ip}$ is getting smaller and smaller until it reaches the first predetermined value $K_{ip,min}$. Accordingly, the locking process state machine circuit 141 turns on the register 1423 which is used for storing the control-adjust signal during the adjusting process, to perform the phase-locking process and control the multiplexer 133 to output the phase difference information polarity $\epsilon_2$, enabling the phase/frequency detector 13 to operate in the phase-tracking state. The route parameter $K_{pd}$ of the reference route sigma-delta modulator feedback circuit 11 is set to the second predetermined value $K_{pd,PT}$, such that the path from the phase/frequency detector 13 to the reference route sigma-delta modulator feedback circuit 11 forms a feedback circuit, resulting that the feedback phase information output by the feedback phase integration circuit 16 complies with the reference phase information output by the reference phase integration circuit 12. Therefore, the frequency output signal $f_{OUT}$ of the digitally controlled oscillator 15 is a frequency signal corresponding to the reference signal frequency $f_{REF}$ multiplied by the total frequency control code N. ($f_{OUT}$=N $f_{REF}$)

The phase-locked loop frequency synthesizer of the present invention further comprises a register 17 and a frequency divider 18.

The register 17 is coupled to an output end of the loop filter 142 and an input end of the digitally controlled oscillator 15, for delaying and synchronizing information output from the loop filter 142, and outputs the control signal to the digitally controlled oscillator 15 when all signals in the loop filter 142 are available.

The frequency divider 18 is coupled to an output end of the digitally controlled oscillator 15 and an input end of the feedback phase integration circuit 16, for dividing the frequency of the output signal generated by the digitally controlled oscillator 15 to generate a signal having a lower frequency and send the signal to the feedback phase integration circuit 16.

Figure 3:
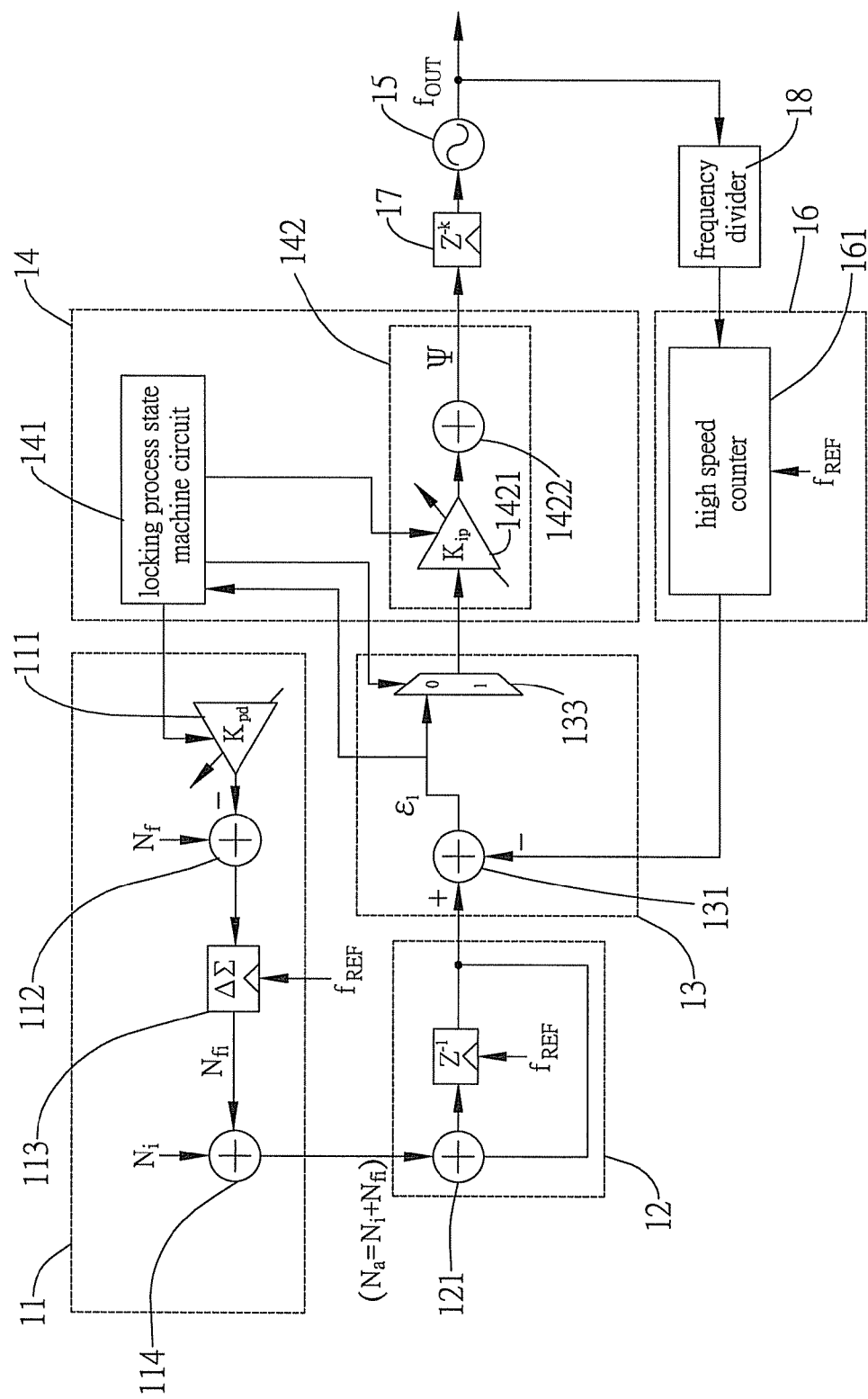
FIG. 3 is a schematic diagram of a phase-locked loop frequency synthesizer according to the present invention when operating in a frequency-acquistin state.

Note that the phase-locked loop frequency synthesizer of the present invention is divided into two stages. During the first stage, the binary phase detector 132 is shut off, the multiplexer 133 selects the upper route, and the route parameter $K_{pd}$ is set to the initial value $K_{pd,0}$ (substantially equal to zero), indicating that the reference route sigma-delta modulator feedback circuit 11 does not pull back a negative feedback from the phase/frequency detector 13. Therefore, the phase-locked loop frequency synthesizer is in a frequency acquisition (FA) stage, as shown in FIG. 3, which is a schematic diagram of a frequency-acquisition loop of the phase-locked loop frequency synthesizer according to the present invention. During the second stage, the binary phase detector 132 is turned on, the route parameter $K_{pd}$ is set to the second predetermined value $K_{pd,PT}$, the register 1423 of the loop filter circuit 142 is fully turned on, the loop parameter $K_{ip}$ is set to the first predetermined value $K_{ip,min}$, and the reference route sigma-delta modulator feedback circuit 11 pulls back a negative feedback from the phase/frequency detector 13. Therefore, the phase-locked loop frequency synthesizer is in a phase tracking (PT) stage, as shown in FIG. 2.

Figure 4:
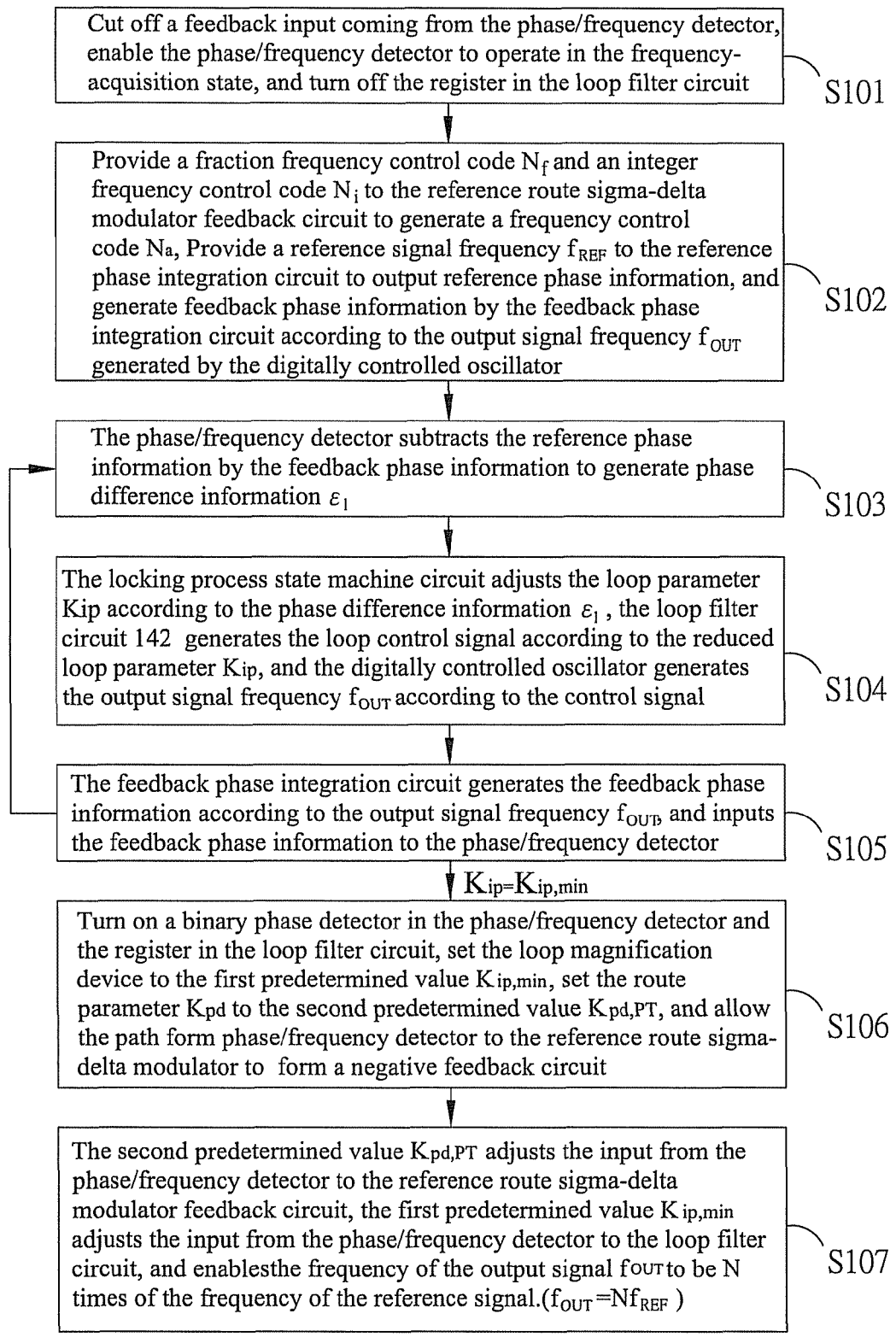
FIG. 4 is a flow chart of a loop locking method applicable to a phase-locked loop frequency synthesizer according to the present invention.

Please refer to FIG. 4, which is a flow chart of a loop locking method of a frequency-locked loop of a phase-locked loop frequency synthesizer according to the present invention. Please also refer to FIGS. 2 and 3, in order to understand the locking process of the phase-locked loop frequency synthesizer in the first stage and in the second stage according to the present invention.

In step S101, cuts off the feedback input from the phase/frequency detector 13 to the reference route sigma-delta modulator feedback circuit 11. Accordingly, the route parameter $K_{pd}$ of the route magnification device 111 is the initial value $K_{pd,0}$ (substantially equal to zero), the phase/frequency detector 13 is enabled to operate in the frequency-acquisition state, which means the binary phase detector 132 of the phase/frequency detector 13 is shut off, the multiplexer 133 selects the upper route, and the loop filter circuit 142 turns off the register 1423, so the loop is in the frequency-acquisition state at the same time. Proceed to step S102.

In step S102, the fraction frequency control code $N_f$ and the integer frequency control code $N_i$ are provided to the reference route sigma-delta modulator feedback circuit 11. The sigma-delta modulator 13 converts the received fraction frequency control code $N_f$ into the fraction control code $N_{fi}$, and then adds the fraction control code $N_{fi}$ to the integer frequency control code $N_i$ so as to generate the frequency control code $N_a$=$N_i$+$N_{fi}$. A reference signal frequency $f_{REF}$ is provided to the reference phase integration circuit 12, and the reference phase integration circuit 12 performs an accumulation process and outputs reference phase information to the phase/frequency detector 13 according to the frequency control code $N_a$=$N_i$+$N_{fi}$. Note that due to the mathematical characteristics of the sigma-delta modulator 113, an accumulated value obtained by the reference phase integration circuit 12 by accumulating the frequency control code $N_a$=$N_i$+$N_{fi}$ is equivalent to an accumulated value obtained by the reference phase integration circuit 12 by accumulating the total frequency control code N=$N_i$+$N_f$ in the long run. Further, the feedback phase integration circuit 16 generates the feedback phase information according to the frequency output signal $f_{OUT}$ generated by the digitally controlled oscillator 15 and transmits the feedback phase information to the phase/frequency detector 13. Proceed to step S103.

In step S103, the phase/frequency detector 13 receives the reference phase information output by the reference phase integration circuit 12 and the feedback phase information output by the feedback phase integration circuit 16, subtracts the reference phase information by the feedback phase information to generate the phase difference information $\epsilon_1$, and outputs the phase difference information $\epsilon_1$ to the loop filter circuit 142. Proceed to step S104.

In step S104, the locking process state machine circuit 141 adjusts the loop parameter $K_{ip}$ according to the phase difference information $\epsilon_1$, and enables the register 1423 of the loop filter circuit 142 to store the control-adjust signal $\psi$, and then reduces the loop parameter $K_{ip}$. The loop filter circuit 142 generates the control-adjust signal $\psi$ according to the reduced loop parameter $K_{ip}$, and then sends the regenerated control-adjust signal $\psi$ to the digitally controlled oscillator 15, and the digitally controlled oscillator 15 generates the frequency output signal $f_{OUT}$ according to the control signal. Proceed to step S105.

In step S105, the feedback phase integration circuit 16 generates the feedback phase information according to the frequency output signal $f_{OUT}$, and the feedback phase information is input to the phase/frequency detector 13. Steps S103 to S105 are iterated until the loop parameter $K_{ip}$ is reduced to the first predetermined value $K_{ip,min}$. Then, proceed to step S106.

Figure 5:
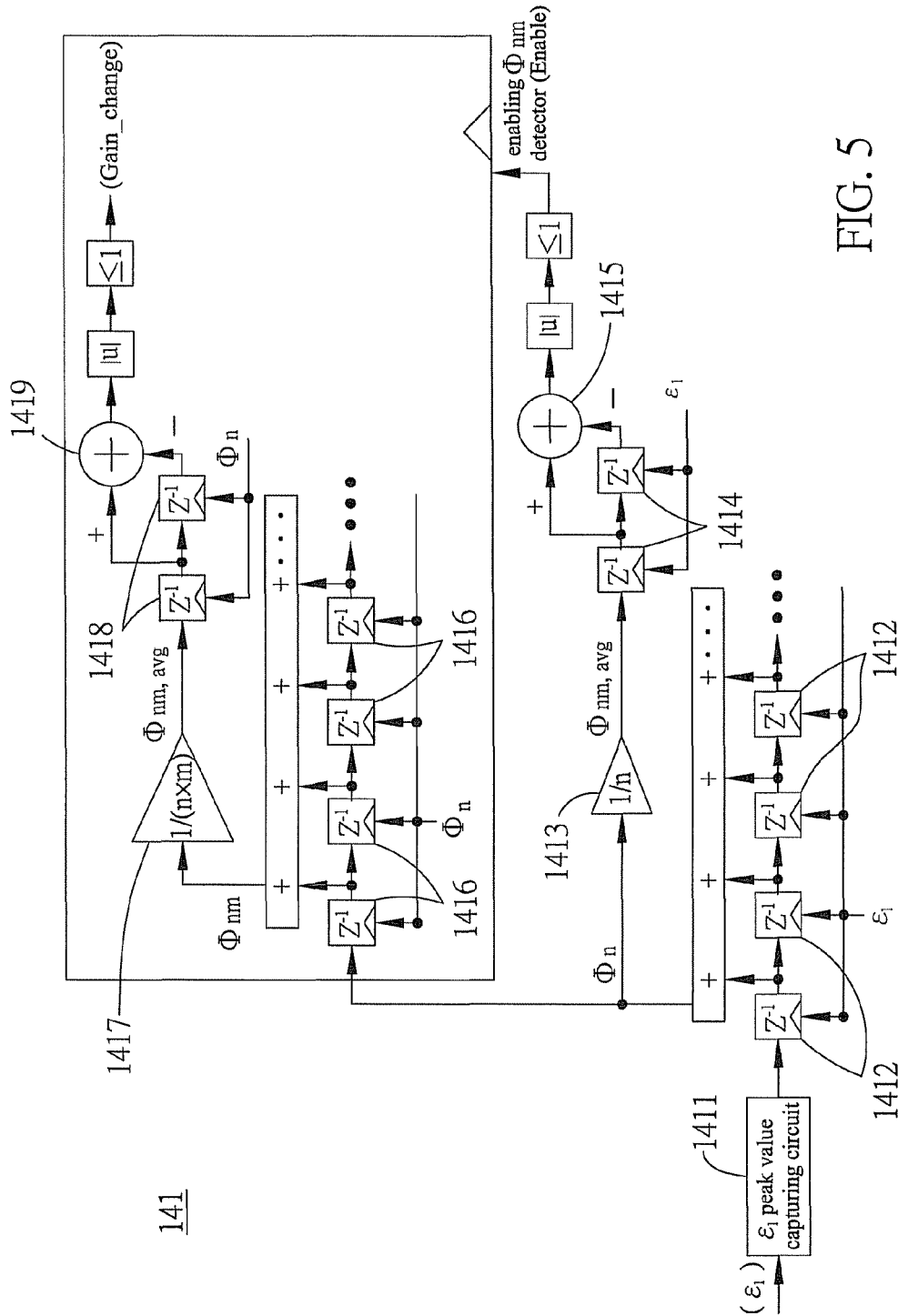
FIG. 5 is a schematic diagram illustrating that a locking process state machine circuit of a phase-locked loop frequency synthesizer adjusts a loop parameter according to the present invention.

Note that in the mechanism described in step S104 that the locking process state machine circuit adjusts the loop parameter $K_{ip}$ according to the phase difference information $\epsilon_1$, the embodiment is shown in FIG. 5, which is a schematic diagram of the adjustment of the loop parameter $K_{ip}$ of the loop filter circuit of the phase-locked loop frequency synthesizer according to the present invention. Note that the embodiment only provides an exemplary embodiment for the adjustment of the loop parameter $K_{ip}$, and other ways to adjust the $K_{ip}$ may be described in other embodiments.

Please refer to FIG. 5. Initially, the phase/frequency detector 13 outputs the phase difference information $\epsilon_1$ to the locking process state machine circuit 141, and the $\epsilon_1$ peak value capturing circuit 1411 in the locking process state machine circuit 141 captures n peak valued of the phase difference information $\epsilon_1$ to n registers 1412. Then, the divider 1413 averages the n peak values of the phase difference information $\epsilon_1$ to obtain an average value $\phi_{n,avg}$. When a difference between two neighboring average values is less than or equal to a predetermined value (the predetermined value is set to 1 in the embodiment; in other embodiments the predetermined value may be set to other values), the next detection mechanism is actuated. The next detector captures mφ$_n$ signals into the registers 1416, and the divider 1417 averages the mφ$_n$ signals to obtain an average value φ$_{nm,avg}$. When a difference between two neighboring average values is less than or equal to a predetermined value (the predetermined value is set to 1 in the embodiment; in other embodiments the predetermined value may be set to other values), a signal that adjusts the loop parameter K$_{ip}$ is emitted, reducing the loop parameter K$_{ip}$ of the loop filter circuit.

In step S106, the locking process state machine circuit 141 turns on the binary phase detector 132 in the phase/frequency detector 13 and the register 1423 in the loop filter circuit 142, sets the loop magnification device 1421 to the first predetermined value K$_{ip,min}$, enables the path from the phase/frequency detector 13 to the reference route sigma-delta modulator feedback circuit 11 to form a negative feedback circuit, and sets the route parameter K$_{pd}$ to the second predetermined value K$_{pd,PT}$, enabling the whole loop to enter the frequency-acquisition state. Proceed to step S107.

In step S107, in the phase-tracking state, the binary phase detector 132 in the phase/frequency detector 13 generates and outputs the phase difference information polarity ε$_2$. As a result, the second predetermined value K$_{pd,PT}$ adjusts the phase difference information polarity ε$_2$ and the adjusted value is sent to the reference route sigma-delta modulator feedback circuit 11; meanwhile, the first predetermined value K$_{ip,min}$ adjusts the phase difference information polarity ε$_2$ and the adjusted value is sent to the loop filter circuit 142, so as to output the control signal for controlling the digitally controlled oscillator. Accordingly, the digitally controlled oscillator generates the frequency output signal f$_{OUT}$ according to the control signal. Therefore, the frequency output signal f$_{OUT}$ fluctuates around the level of the frequency-acquisition state performed in the first stage while approaching the target frequency, i.e., N times of the reference signal frequency f$_{REF}$, gradually.

Figure 6:
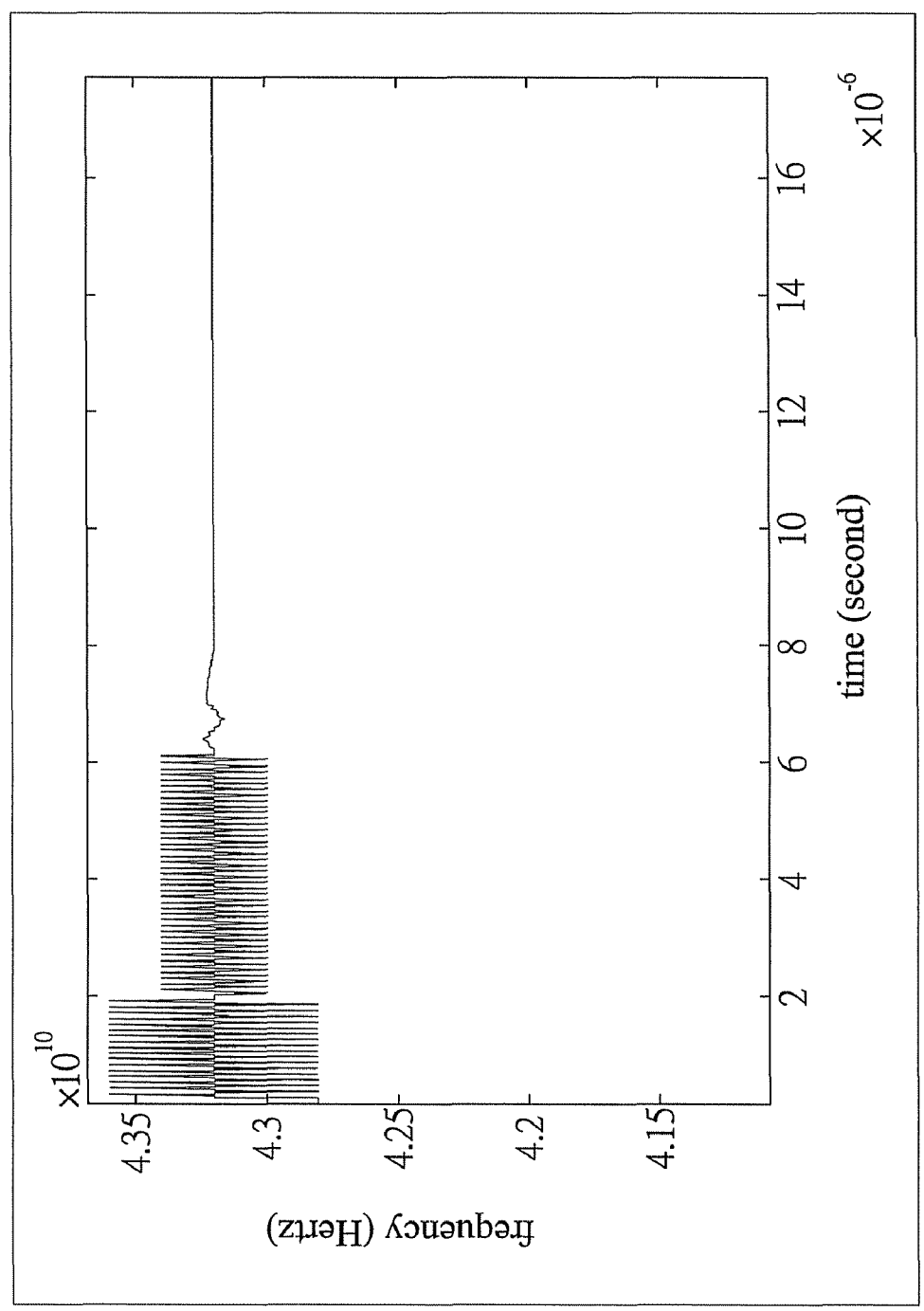
FIG. 6 is a frequency-acquisition and phase-tracking simulation process diagram of the phase-locked frequency synthesizer according to the present invention.

In sum, the loop locking method of the phase-locked loop frequency synthesizer of the present invention involves performing the frequency-acquisition process in the first stage, wherein the route parameter K$_{pd}$ of the reference route sigma-delta modulator feedback circuit is zero and the loop parameter K$_{ip}$ of the loop filter circuit is adjusted and dwindles to the first predetermined value K$_{ip,min}$, and then the register in the loop filter circuit is turned on to enter the second stage, the phase-locking process. FIG. 6 is a schematic diagram of the frequency-acquisition and phase-locking processes of the loop locking method of the phase-locked loop frequency synthesizer according to the present invention. The frequency-acquisition stage has a wider locking range and is performed for 6×10$^{-5}$ second approximately, and then the phase-locking stage is performed afterward. FIG. 6 also reveals that the phase-locking stage moves up and down within a small range of the level of the previous frequency-acquisition stage, allowing the output signal to be N times the reference signal.

It can be understood from the aforesaid embodiments that when the high-speed counter in the feedback phase integration circuit cannot detect the fractional part output from the digitally controlled oscillator, the average value of the fraction control code N$_{fi}$ output by the sigma-delta modulator is zero in concept, so the average value obtained by inputting frequency control code N$_a$=N$_{fi}$+N$_i$ into the reference phase integration circuit (accumulator) in the phase-locked loop frequency synthesizer is merely the set integer frequency control code N$_i$. In other words, when the rising edge of the reference signal is coming, if the high-speed counter in the feedback phase integration circuit detects that the fractional phase output by the digitally controlled oscillator is carried into a part of an integer, the fraction control code N$_{fi}$ output by the sigma-delta modulator will be turned into 1 at the same rising edge of the reference signal. Accordingly, in the long run the average value obtained by inputting the N$_a$=N$_{fi}$+N$_i$ into the reference phase integration circuit (accumulator) equals to the total frequency control code N(N=N$_i$+N$_f$). Therefore, through the embodying of the loop locking method of the phase-locked loop frequency synthesizer according to the present invention, the reference phase integration circuit may carry numbers simultaneously to reduce the phase difference of the phase/frequency detector, and speed up the loop-locking, allowing the phase-locked loop frequency synthesizer of the present invention to make an non-integer frequency magnification locking by using a simple phase/frequency detector, without more redundant hardware and complicated operation units.

Additionally, the loop locking method of the present invention first performs the frequency-acquisition process and then performs the phase-locking process. Accordingly, the loop has a wide locking range, and the characteristics of fast locking and low noises can be both achieved.

In conclusion, in the phase-locked loop frequency synthesizer and the loop locking method of the present invention, a the sigma-delta modulator is used in the reference route sigma-delta modulator feedback circuit to reduce fractional spurs and shape the noises sent from the phase/frequency detector; furthermore, it reduces the bit number of the phase information so as to alleviate the load of the reference phase integration circuit. Additionally, through the embodying of the present invention which first performs the frequency-acquisition process and then performs the phase-locking process, the locking speed of the phase-locked loop frequency synthesizer is increased. Therefore, using a digital circuit to realize a frequency synthesizer yields the advantages of resisting noise, increasing resolution and ease in integration. Moreover, it will not be affected by environment, temperature and voltage variations.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A phase-locked loop frequency synthesizer, comprising:
   a reference route sigma-delta modulator feedback circuit for generating a frequency control code according to a fraction frequency control code and an integer frequency control code;
   a reference phase integration circuit for generating and outputting reference phase information according to the frequency control code generated by the reference route sigma-delta modulator feedback circuit;
   a phase/frequency detector for detecting feedback phase information and the reference phase information, and outputting phase difference information;
   a loop filter including a locking process state machine circuit and a loop filter circuit with a loop parameter, the locking process state machine circuit being for adjusting the loop parameter according to the phase difference information, and the loop filter circuit being for outputting a control signal according to the adjusted loop parameter;

an oscillator for generating a frequency output signal according to the control signal outputted by the loop filter circuit; and a feedback phase integration circuit for generating the feedback phase information according to the frequency output signal provided by the oscillator, and outputting the feedback phase information to the phase/frequency detector, wherein, the reference route sigma-delta modulator feedback circuit pulls a negative feedback from the phase/frequency detector to the reference phase integration circuit, enabling the oscillator to generate the frequency output signal corresponding to the reference signal.

2. The phase-locked loop frequency synthesizer of claim 1, wherein the reference route sigma-delta modulator feedback circuit comprises a route magnification device with a route parameter, and adjusts the phase difference information by setting the route parameter.

3. The phase-locked loop frequency synthesizer of claim 2, wherein an initial value of the route parameter is zero, and that of the phase difference information is also zero.

4. The phase-locked loop frequency synthesizer of claim 1, wherein the reference route sigma-delta modulator feedback circuit comprises a sigma-delta modulator, and the reference phase integration circuit is an accumulator, the sigma-delta modulator converting the fraction frequency control code into a fraction control code that is added by the integer frequency control code, the accumulator accumulating the addition value of the fraction control code and the integer frequency control code and generating the reference phase information.

5. The phase-locked loop frequency synthesizer of claim 1, wherein the phase/frequency detector includes a multiplexer, which is operable either in a frequency-acquisition state or in a phase-tracking state, such that the phase/frequency detector outputs the phase difference information directly while the multiplexer is operating in the frequency-acquisition state and converts the phase difference information into a phase difference information polarity by using a binary phase detector while the multiplexer is operating in the phase-tracking state.

6. The phase-locked loop frequency synthesizer of claim 5, wherein the multiplexer is coupled to an output end of the binary phase detector and an input end of the loop filter circuit and the reference route sigma-delta modulator feedback circuit, and the multiplexer is controlled by a command of the locking process state machine circuit to operate either in the frequency-acquisition state or in the phase-tracking state.

7. The phase-locked loop frequency synthesizer of claim 2, wherein the locking process state machine circuit sets the route parameter to a second predetermined value according to the phase difference information, so as to adjust the phase difference information fed from the phase/frequency detector back to the reference route sigma-delta modulator feedback circuit.

8. The phase-locked loop frequency synthesizer of claim 1, wherein the loop filter circuit includes a loop magnification device having the loop parameter that is set by the locking process state machine circuit, so as to adjust the control signal output by the loop filter.

9. The phase-locked loop frequency synthesizer of claim 1, wherein the loop filter circuit includes a register that enables the loop filter circuit to perform a phase-locking process when the loop parameter is set to the first predetermined value by the locking process state machine circuit.

10. The phase-locked loop frequency synthesizer of claim 1, further comprises a frequency divider for dividing the output signal output from the oscillator to generate a signal with lower frequency, and to then send the signal with lower frequency to the feedback phase integration circuit.

11. A loop locking method comprising the steps of:
(1) cutting off a feedback input from a phase/frequency detector by a reference route sigma-delta modulator feedback circuit, for the phase/frequency detector to operate in a frequency-acquisition state and a loop filter circuit to shut off a register;
(2) providing a fraction frequency control code and an integer frequency control code to the reference route sigma-delta modulator feedback circuit to generate the frequency control code, and providing a reference signal to a reference phase integration circuit to output the reference phase information to the phase/frequency detector according to the fraction and integer frequency control codes, while enabling a feedback phase integration circuit to generate feedback phase information according to the output signal of the oscillator;
(3) enabling the phase/frequency detector to calculate a difference between the reference phase information and the feedback phase information and then output phase difference information;
(4) enabling the locking process state machine circuit to adjust a loop parameter of the loop filter circuit according to the phase difference information, to allow the loop filter circuit to output a control signal according to the adjusted loop parameter, and to then have an oscillator generate the output signal according to the control signal;
(5) generating the feedback phase information from the output signal by the feedback phase integration circuit, inputting the feedback phase information to the phase/frequency detector, and iterating steps (3) through (5) if the loop parameter is still greater than a first predetermined value, or otherwise, proceeding to step (6); and
(6) enabling a locking process state machine circuit to turn on a register of the loop filter circuit and keep the loop parameter at a first predetermined value, and enabling the phase/frequency detector to operate in a phase-tracking state and set a route parameter of the reference route sigma-delta modulator feedback circuit to a second predetermined value to allow the path from the phase/frequency detector to the reference route sigma-delta modulator feedback circuit to form a negative feedback circuit such that the output signal of the oscillator becomes the frequency signal corresponding to the reference signal.

12. The loop locking method of claim 11, wherein step (2) further comprises the sub-steps of:
(2-1) enabling the sigma-delta modulator of the reference route sigma-delta modulator feedback circuit to convert the fraction frequency control code into the fraction control code; and
(2-2) adding the fraction control code to the integer control code so as to generate the frequency control code.

13. The loop locking method of claim 11, wherein the phase integration circuit is an accumulator, and step (2) further comprises enabling the accumulator to perform an accumulation process on the frequency control code every reference signal, so as to output the reference phase information to the phase/frequency detector.

14. The loop locking method of claim 11, wherein step (4) further comprises the sub-steps of:
(4-1) enabling the register of the loop filter circuit to store a control-adjust signal and then reducing the loop parameter; and (4-2) enabling the loop filter circuit to generate a loop control signal according to the reduced loop parameter, and adding the loop control signal to the control-adjust signal so as to generate the control signal.

15. The loop locking method of claim 11, wherein step (6) further comprises the sub-steps of:
(6-1) enabling the binary phase detector of the phase/frequency detector to generate and output the phase difference information polarity; and
(6-2) using the second predetermined value of the route parameter to adjust the phase difference information polarity output from the phase/frequency detector to the reference route sigma-delta modulator feedback circuit, and using the first predetermined value of the loop parameter to adjust a phase difference information polarity output from the phase/frequency detector to the loop filter circuit, thereby enabling the output signal of the oscillator to form the frequency signal corresponding to the reference signal in a feedback way.

* * * * *